(12) United States Patent
Feilchenfeld et al.

(10) Patent No.: US 9,202,869 B2
(45) Date of Patent: Dec. 1, 2015

(54) SELF-ALIGNED BIPOLAR JUNCTION TRANSISTOR HAVING SELF-PLANARIZING ISOLATION RAISED BASE STRUCTURES

(71) Applicant: International Business Machines Corporation, Armonk, NY (US)

(72) Inventors: Natalie B. Feilchenfeld, Jericho, VT (US); Qizhi Liu, Lexington, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 91 days.

(21) Appl. No.: 13/890,341

(22) Filed: May 9, 2013

(65) Prior Publication Data

US 2014/0332927 A1 Nov. 13, 2014

(51) Int. Cl.
*H01L 29/08* (2006.01)
*H01L 29/66* (2006.01)
*H01L 29/732* (2006.01)

(52) U.S. Cl.
CPC ...... *H01L 29/0821* (2013.01); *H01L 29/66287* (2013.01); *H01L 29/732* (2013.01)

(58) Field of Classification Search
None
See application file for complete search history.

(56) References Cited

U.S. PATENT DOCUMENTS

| | | | |
|---|---|---|---|
| 6,667,521 B2 | 12/2003 | Ahlgren et al. | |
| 6,777,302 B1 | 8/2004 | Chen et al. | |
| 7,037,798 B2 | 5/2006 | Adam et al. | |
| 7,288,827 B2 | 10/2007 | Chen et al. | |
| 7,642,168 B1 * | 1/2010 | Xu | H01L 29/1004 |
| | | | 438/202 |
| 7,696,034 B2 | 4/2010 | Geiss et al. | |
| 7,719,031 B2 | 5/2010 | Saitoh et al. | |
| 7,776,704 B2 | 8/2010 | Dunn et al. | |
| 7,888,745 B2 | 2/2011 | Khater et al. | |
| 7,935,986 B2 | 5/2011 | Khater | |
| 8,236,662 B2 | 8/2012 | Feilchenfeld et al. | |
| 2007/0298578 A1 * | 12/2007 | Khater | H01L 29/7378 |
| | | | 438/322 |
| 2008/0203490 A1 * | 8/2008 | Feilchenfeld | H01L 21/8249 |
| | | | 257/370 |
| 2011/0312147 A1 * | 12/2011 | Harame | H01L 29/0649 |
| | | | 438/353 |

OTHER PUBLICATIONS

Liu, et al., "A Self-Aligned Sacrificial Emitter Process for High Performance SiGe HBT in BiCMOS," 2012 The Electrochemical Society, 2012, 1 page.

* cited by examiner

*Primary Examiner* — Steven Loke
*Assistant Examiner* — Juanita Rhodes
(74) *Attorney, Agent, or Firm* — Gibb & Riley, LLC; Michael J. LeStrange, Esq.

(57) ABSTRACT

A collector region is formed between insulating shallow trench isolation regions within a substrate. A base material is epitaxially grown on the collector region and the shallow trench isolation regions. The base material forms a base region on the collector region and extrinsic base regions on the shallow trench isolation regions. Further, a sacrificial emitter structure is patterned on the base region and sidewall spacers are formed on the sacrificial emitter structure. Planar raised base structures are epitaxially grown on the base region and the extrinsic base regions, and the upper layer of the raised base structures is oxidized. The sacrificial emitter structure is removed to leave an open space between the sidewall spacers and an emitter is formed within the open space between the sidewall spacers. The upper layer of the raised base structures comprises a planar insulator electrically insulating the emitter from the raised base structures.

17 Claims, 14 Drawing Sheets

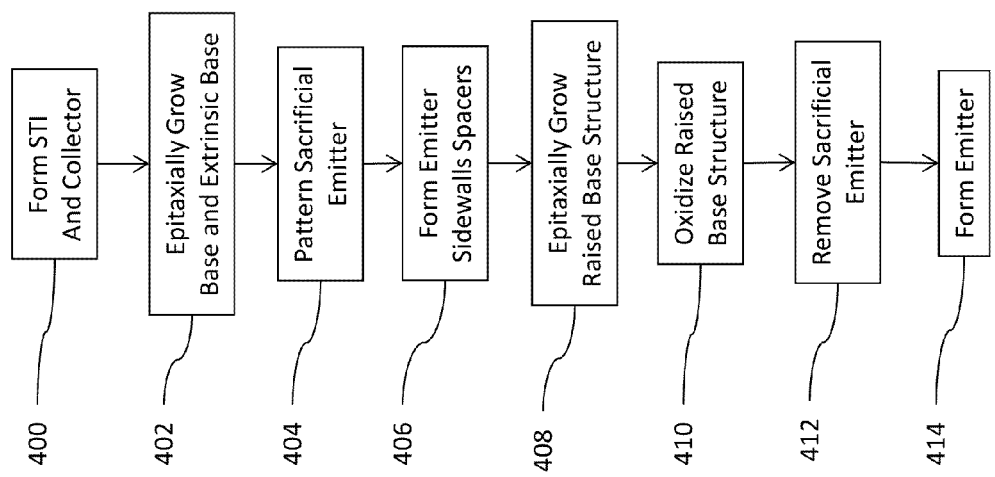

SELF-ALIGNED BIPOLAR JUNCTION TRANSISTOR HAVING SELF-PLANARIZING ISOLATION RAISED BASE STRUCTURES

BACKGROUND

The present disclosure relates to transistors, and more specifically, to methods that utilize self-alignment processes and epitaxial growth processes (and the resulting structures).

A bipolar junction transistor (BJT or bipolar transistor) is a type of transistor that relies on the contact of two types of semiconductor for its operation. One type of semiconductor is formed with positive-type dopants, and is therefore referred to as a P-type semiconductor; while another type of semiconductor is formed with negative-type dopants, and is therefore referred to as an N-type semiconductor. Bipolar junction transistors can be used as amplifiers, switches, or in oscillators. Bipolar junction transistors come in two types, or polarities, known as PNP and NPN, with the P and the N representing the different doping types of the three main terminal regions (collector, base, and emitter). An NPN transistor comprises two semiconductor junctions that share a thin P-doped anode region, and a PNP transistor comprises two semiconductor junctions that share a thin N-doped cathode region.

SUMMARY

Exemplary methods herein form a collector region between insulating shallow trench isolation regions within a substrate and epitaxially grow a base material on the collector region and the shallow trench isolation regions. The base material forms a base region on the collector region and forms extrinsic base regions on the shallow trench isolation regions. Further, such methods pattern a sacrificial emitter structure on the base region and form sidewall spacers on the sacrificial emitter structure.

Then, such methods epitaxially grow raised base structures on the base region and the extrinsic base regions. When growing the raised base structures, such methods first grow a first layer of the raised base structures to have a first concentration of doping material on the base region and the extrinsic base regions. Then (potentially in a continuous process) the methods grow the upper layer of the raised base structures to have a second concentration of the doping material on the first layer of the raised base structures. The second concentration of doping material is higher than the first concentration of the doping material.

When forming the sidewall spacers, such methods simultaneously form raised base limiting structures over portions of the extrinsic base regions that are distal to the base region. The raised base structures extend on the extrinsic base regions in a direction from the base region only to where the raised base limiting structures are positioned (on the distal portions of the extrinsic base regions). Thus, the raised base limiting structures limit the size of the raised base structures (limit how far from the base region the raised base structures extend from the center of the base region).

The base region has an upper surface connected to the sidewall spacers by an oxide. The upper layer of the raised base structures is the surface opposite the location where the raised base structures contact the base region (the upper surface of the base region) and opposite the location where the raised base structures contact the extrinsic base regions. The sidewall spacers extend a first distance from the upper surface of the base region and the raised base structures extend a second (lesser) distance from the upper surface of the base region, such that the sidewall spacers are taller than the raised base structures (when measured from the upper surface of the base region).

Such methods then oxidize the upper layer of the raised base structures. The oxidizing of the upper layer of the raised base structures forms a planar isolation layer. The isolation layer is generally parallel to the upper surface of the base region. These methods then remove the sacrificial emitter structure (including the underlying oxide) to leave an open space between the sidewall spacers and to expose the base region through the open space between the sidewall spacers. This allows such methods to form an emitter within the open space between the sidewall spacers that directly contacts the upper surface of the base region. The emitter extends over the sidewall spacers on to the raised base structures and the isolation layer electrically insulates the emitter from the raised base structures. Further, because the epitaxial growth process of the upper layer of the raised structure (and later oxidation) naturally forms the planar isolation layer, this structure is sometimes referred to herein as self-planarizing isolation raised base structures. These self-planarizing isolation raised base structures also do not require any additional processing (such as chemical mechanical planarization (CMP)) to become planar; instead, the epitaxial process and the oxidation process themselves create a planar surface without any additional processing steps.

Such methods produce various integrated circuit structures (such as PNP or NPN bipolar junction transistors). Such integrated circuit structures include a collector region within a substrate between insulator regions (shallow trench isolation (STI) regions). An epitaxial base material is positioned on the collector region and the insulator regions. This epitaxial base material comprises a base region on the collector region and comprises extrinsic base regions on the insulator regions. Further, an emitter is positioned on the base region. The emitter has sidewalls perpendicular to the bottom surface of the emitter that contacts the base region. The integrated circuit structure includes sidewall spacers on the sidewalls of the emitter.

In such structures, epitaxial raised base structures are positioned on the base region and the extrinsic base regions. The raised base structures comprise a lower first layer on the base region and the extrinsic base regions, and an upper layer on the first layer of the raised base structures. Thus, the upper layer of the raised base structures is opposite the location where the raised base structures contact the base region and the extrinsic base regions. The lower first layer of the raised base structures has a first concentration of doping material, and the upper layer of the raised base structures has a second concentration of the doping material that is higher than the first concentration of the doping material.

The integrated circuit structure further includes raised base limiting structures on distal portions of the extrinsic base regions that are distal to the base region. The raised base structures extend on the extrinsic base regions in a direction from the base region only to where the raised base limiting structures are positioned on the distal portions of the extrinsic base regions. Therefore, the raised base limiting structures are positioned on distal portions of the extrinsic base regions to limit the size of the raised base structures.

The base region has an upper surface connected to the sidewall spacers by an oxide. The sidewall spacers extend a first distance from the upper surface of the base region. The upper layer of the raised base structures is generally parallel to the upper surface of the base region. The upper layer of the raised base structures extends a second distance from the upper surface of the base region that is less than the first distance, such that the sidewall spacers are taller than the raised base structures (when measured from the upper surface of the base region). Further, the sidewall spacers have distal ends extending a first distance from the upper surface of the base region and the emitter extends a second (greater) distance from the upper surface of the base region. The emitter extends over the sidewall spacers on to the raised base structures; however, the isolation layer electrically insulates the emitter from the raised base structures.

BRIEF DESCRIPTION OF THE DRAWINGS

The embodiments herein will be better understood from the following detailed description with reference to the drawings, which are not necessarily drawn to scale and in which:

FIG. 15 is a flow diagram illustrating embodiments herein.

DETAILED DESCRIPTION

Figure 1:
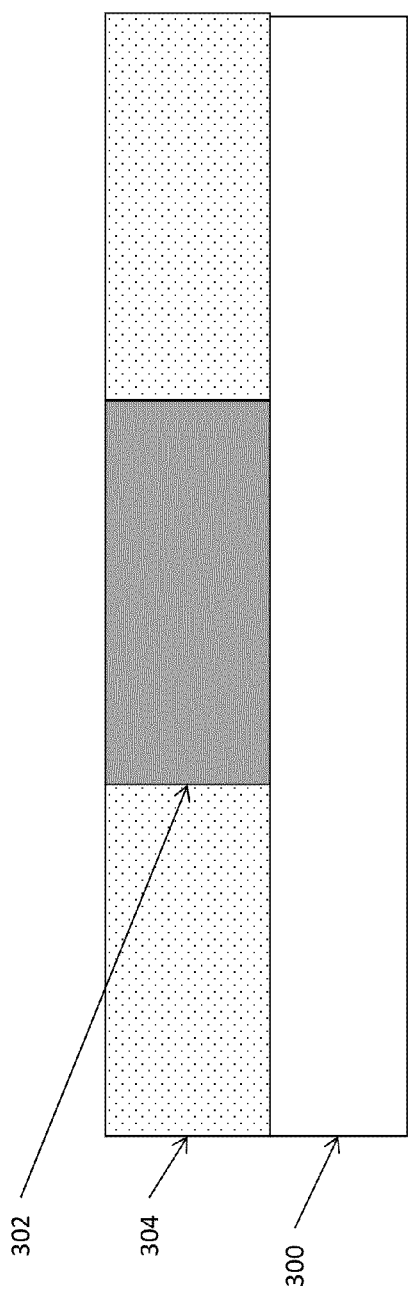
FIG. 1 is a schematic diagram of a partially completed integrated circuit structure according to methods and devices herein.

FIGS. 1-14 illustrate an integrated circuit structure (e.g., bipolar junction transistor) in various processing stages; and FIG. 15 is a flow diagram illustrating an overview of the processing occurring in FIGS. 1-14. Beginning in item 400 in FIG. 15, the processing herein forms a collector between shallow trench isolation (STI) regions in a substrate. More specifically, as illustrated in FIG. 1, exemplary methods herein form a collector region 302 between insulating shallow trench isolation regions 304 within a substrate 300.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. The shallow trench isolation structures are well-known to those ordinarily skilled in the art and are generally formed by patterning openings/trenches within the substrate and growing or filling the openings with a highly insulating material (this allows different active areas of the substrate to be electrically isolated from one another).

Figure 2:
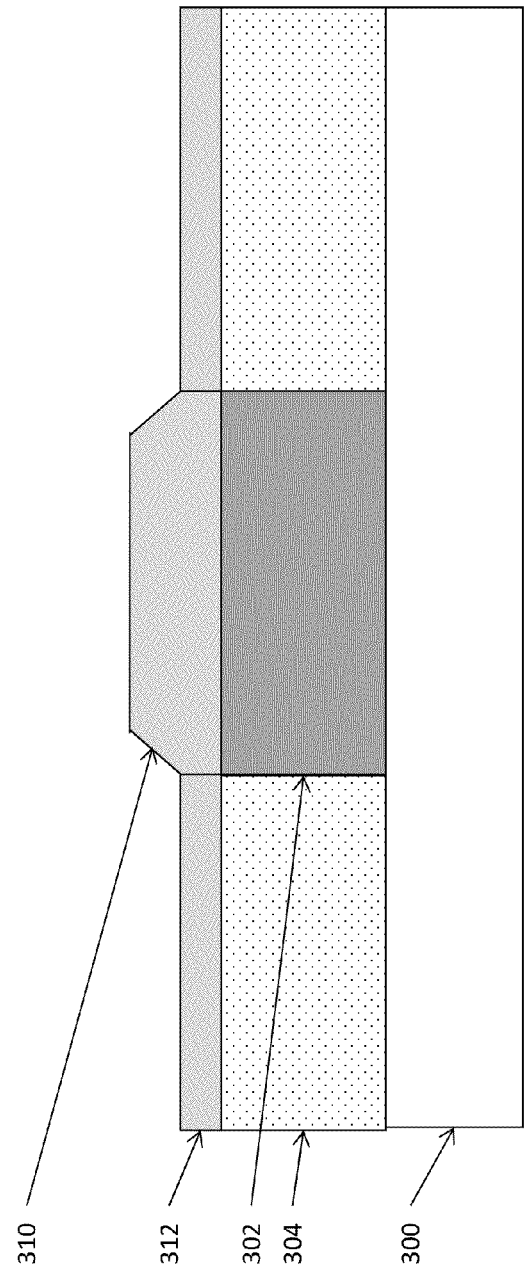
FIG. 2 is a schematic diagram of a partially completed integrated circuit structure according to methods and devices herein.

As illustrated in item 402 in FIG. 15, the methods herein epitaxially grow the base region and the extrinsic base regions from the collector and STI regions. More specifically, as shown in FIG. 2, the methods herein epitaxially grow a base material on the collector region 302 and the shallow trench isolation regions 304. The base material forms a base region 310 on the collector region 302 and forms extrinsic base regions 312 on the shallow trench isolation regions 304. In one example, the epitaxial growth process can be a low temperature epitaxial (LTE) growth process (typically at a growth temperature ranging from 400° C. to 850° C.).

Epitaxial films may be grown from gaseous or liquid precursors. Because the substrate acts as a seed crystal, the deposited film may lock into one or more crystallographic orientations with respect to the substrate crystal. Therefore, depending upon the structure of the shallow trench isolation regions 304 and the collector region 302, the base region 310 can be structurally different than the extrinsic base regions 312. In the example shown in FIG. 2, the epitaxial growth process produces more material above the collector 302, because of the differences between the underlying shallow trench isolation regions 304 and the collector 302.

As noted above, bipolar junction transistors are generally either NPN or PNP semiconductor structures; therefore, the polarity of the dopant in the collector 302 will be opposite the polarity of the dopant used for the base material. For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Also for purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a dielectric stack of $SiO_2$ and Si3N4, and metal oxides like tantalum oxide. The thickness of dielectrics herein may vary contingent upon the required device performance.

As illustrated in item 404 in FIG. 15, these methods then pattern a sacrificial emitter on the base region; and as shown in item 406 form sidewall spacers on the sacrificial emitter structure. More specifically, as shown in FIG. 3, such methods pattern a sacrificial emitter structure 322 on the base region 310 and form sidewall spacers 326 on the sacrificial emitter structure 322 (see FIG. 5 for the completed sidewall spacers 326).

Figure 3:
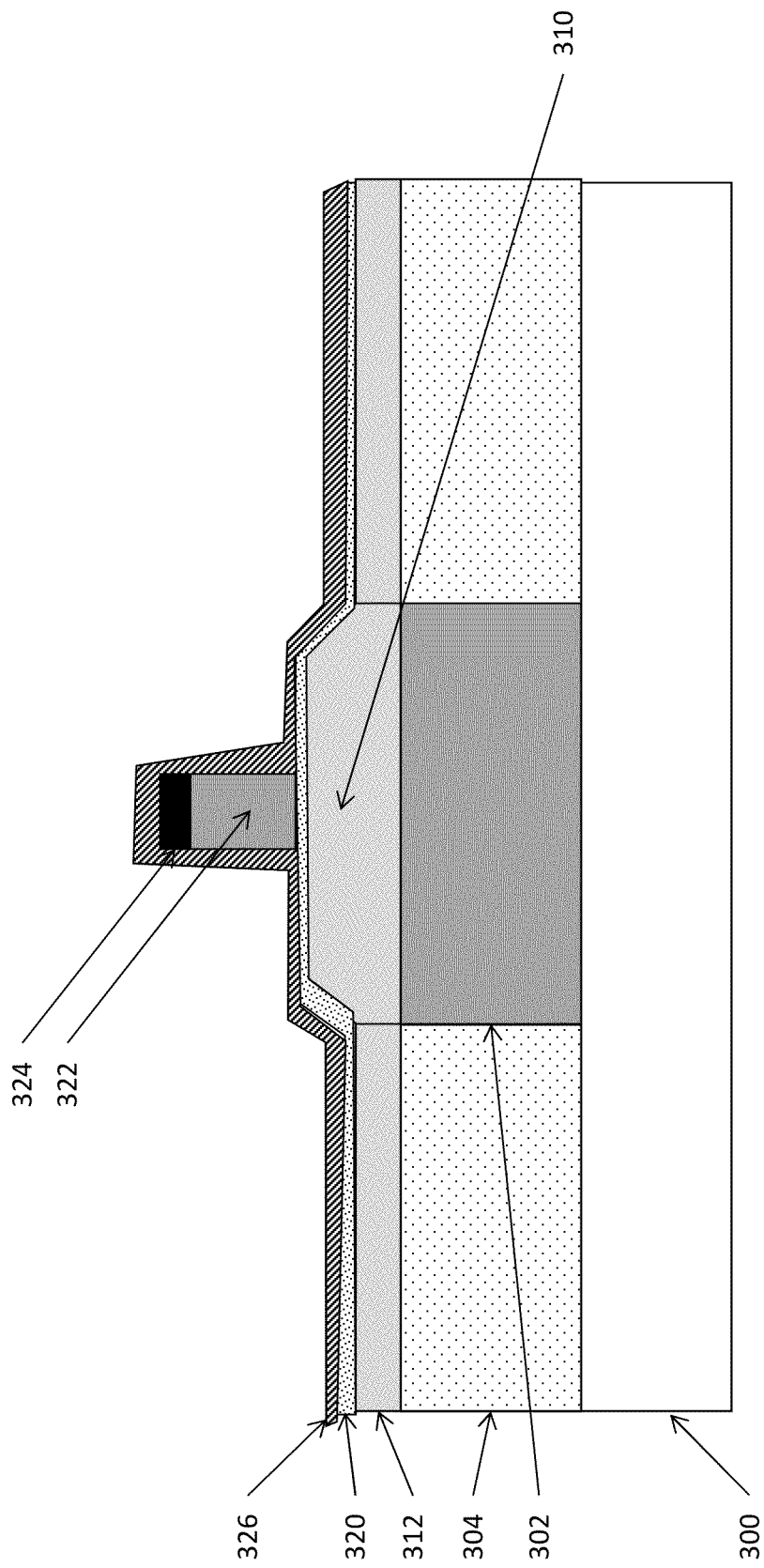
FIG. 3 is a schematic diagram of a partially completed integrated circuit structure according to methods and devices herein.

More specifically, as shown in FIG. 3, these processing steps first form a conformal insulating layer 320 (such as a deposited or oxidized material). Many different conformal insulators could be utilized, including thermally oxidized silicon. Thermal oxidation of silicon is usually performed at a temperature between 800° C. and 1200° C., resulting in a so called High Temperature Oxide (HTO) layer.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a positive resist (illuminated portions remain) or negative resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Thus, using such common lithographic patterning techniques, the methods herein pattern the sacrificial emitter 322 and an overlying hard mask material, which is commonly referred to as a cap 324. The processing steps used to pattern the sacrificial emitter 322 and the cap 324 are not shown because they are well known to those ordinarily skilled in the art, and to maintain focus on the salient features of the methods herein. As would be understood by those ordinarily skilled in the art, any appropriate material can be used for the cap 324 and the sacrificial emitter 322, because eventually both structures will be removed and will not be included in the final integrated circuit device.

Figure 4:
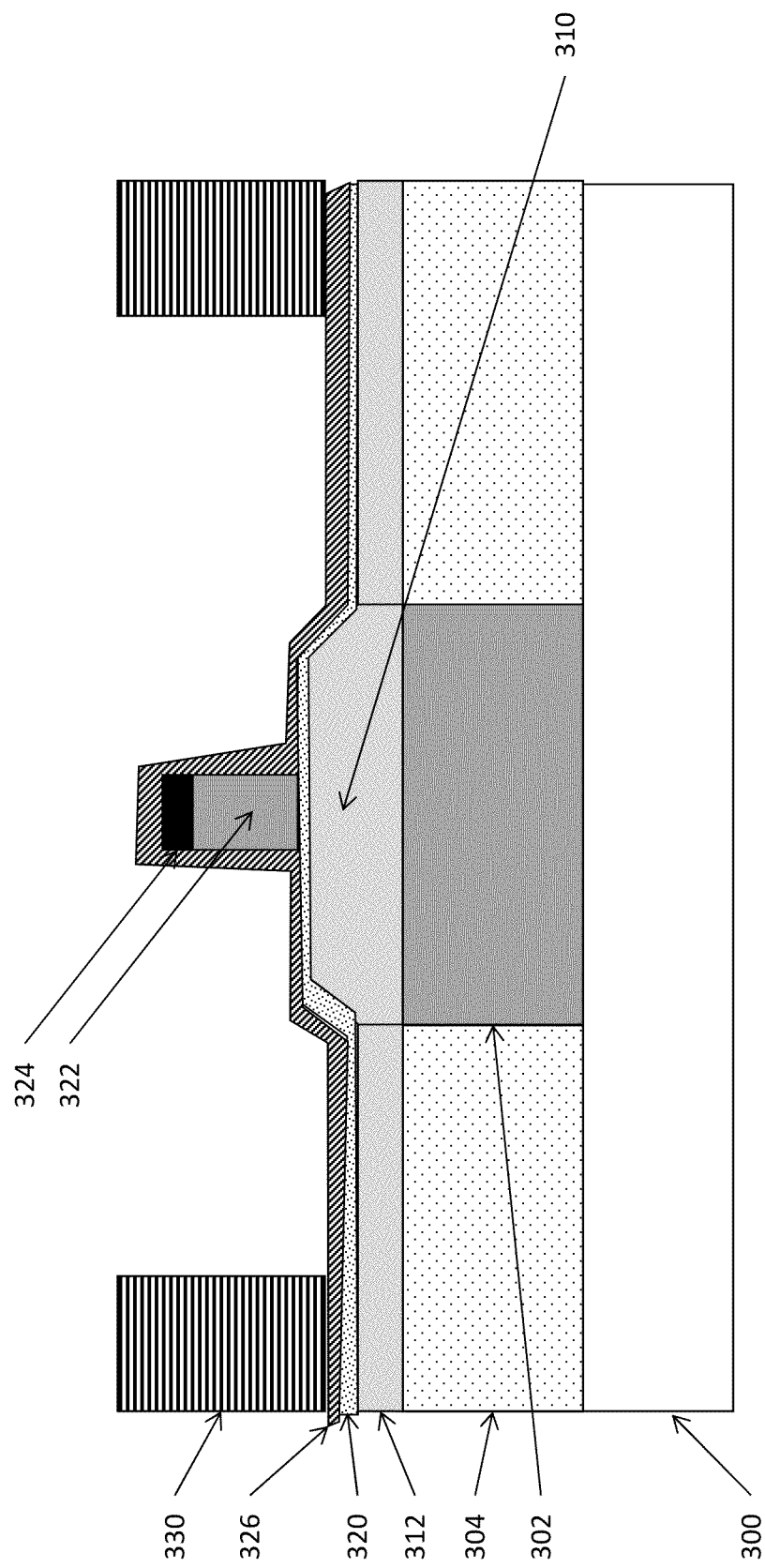
FIG. 4 is a schematic diagram of a partially completed integrated circuit structure according to methods and devices herein.
Figure 5:
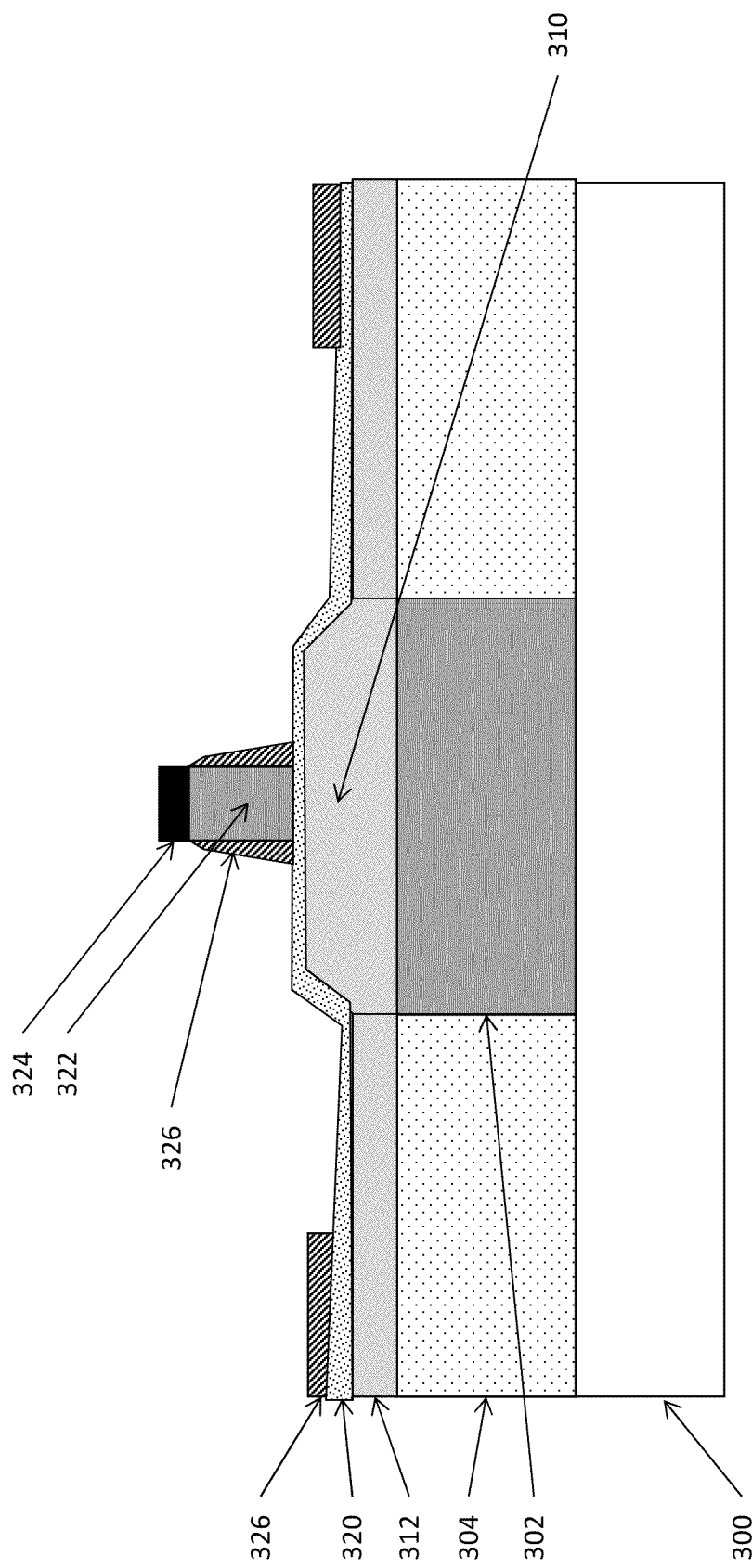
FIG. 5 is a schematic diagram of a partially completed integrated circuit structure according to methods and devices herein.

As also shown in FIG. 3, a conformal material 326 that will eventually become the sidewall spacers of the emitter is deposited over the structure after the sacrificial emitter 322 and cap 324 are formed. This conformal material 326 can be any appropriate material, such as a nitride. In FIG. 4, a photoresist 330 is formed using the processing discussed above. Then, in FIG. 5, one of the selective material removal processes discussed above is performed to remove portions of the conformal layer 326. The structure shown in FIG. 5 illustrates the device after the photoresist 330 has been removed. As shown in FIG. 5, the only portions of the conformal material 326 remaining after the selective material removal process are the sidewall spacers and conformal material above the extrinsic base regions 312.

Figure 6:
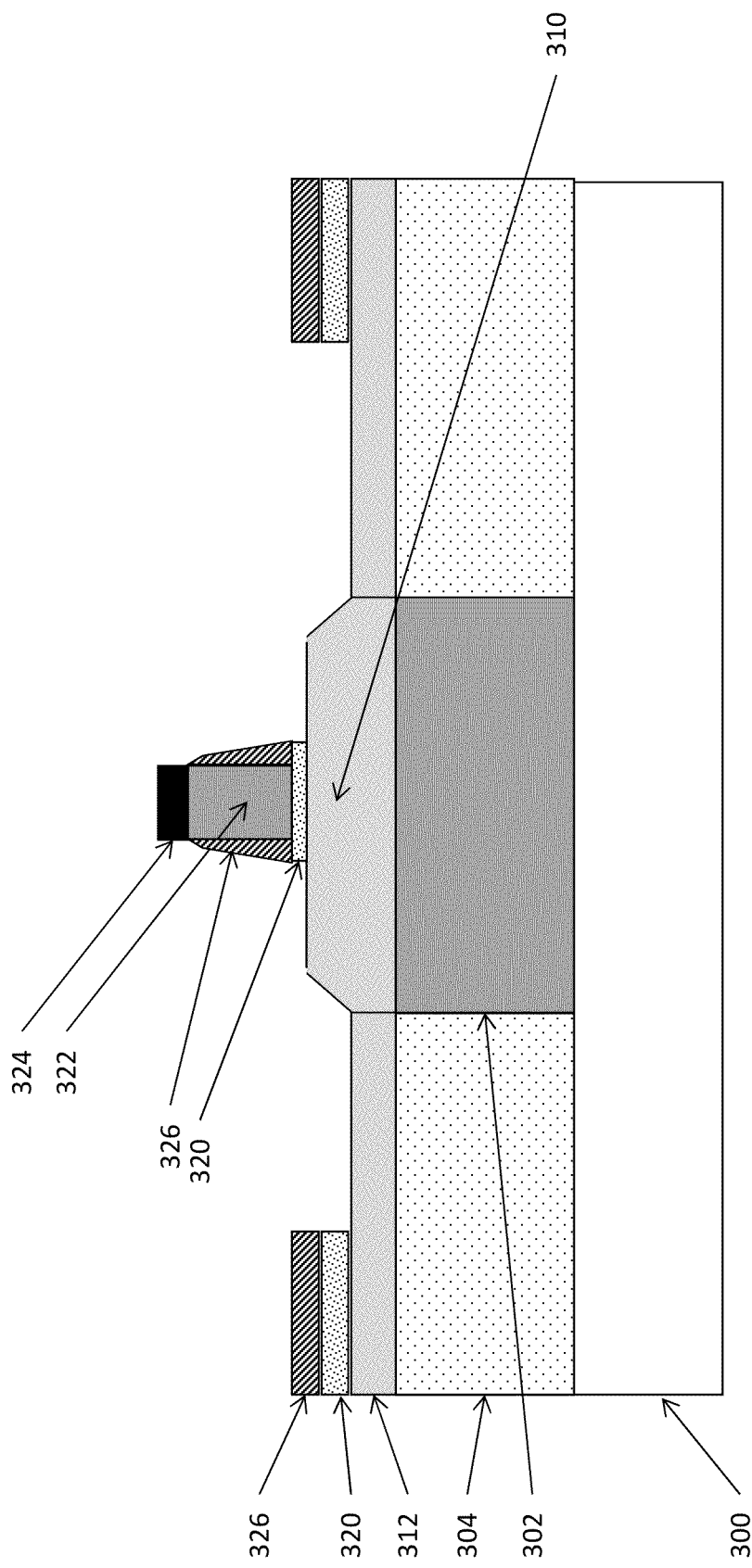
FIG. 6 is a schematic diagram of a partially completed integrated circuit structure according to methods and devices herein.

Subsequent to the processing shown in FIG. 5, a similar (but different) selective material removal process is utilized to remove portions of the conformal insulating layer 320 that are not covered by the conformal material 326 (as shown in FIG. 6). In this example, the material removal process shown in FIG. 6 selectively attacks the insulating layer 320 and does not substantially affect the conformal material 326. Thus, as shown in FIGS. 3-6, when forming the sidewall spacers 326, such methods simultaneously form additional structures 320/326 (which are referred to herein as "raised base limiting structures") over portions of the extrinsic base regions 312 that are distal to the base region 310.

For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

Figure 7:
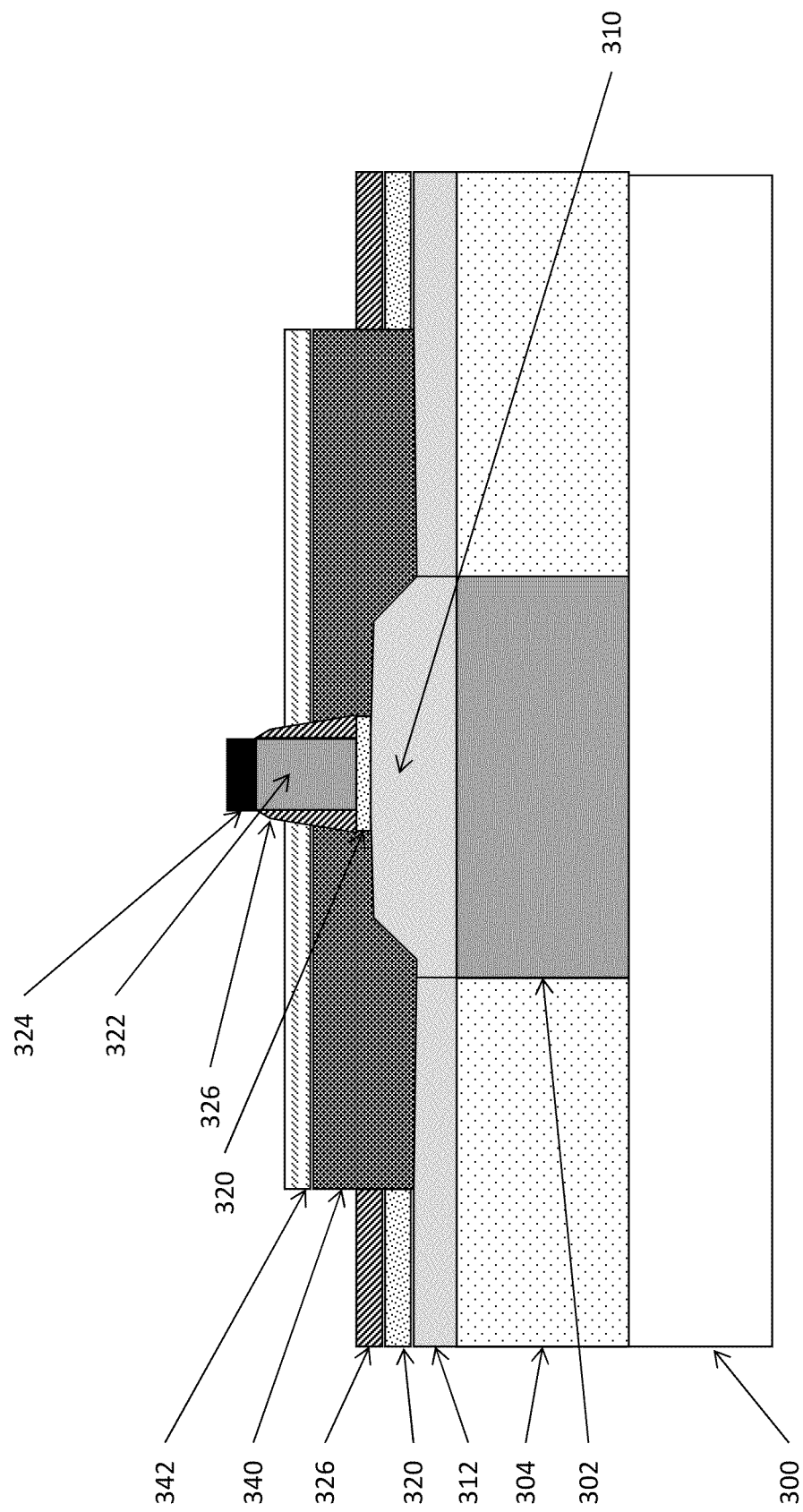
FIG. 7 is a schematic diagram of a partially completed integrated circuit structure according to methods and devices herein.

Then, as shown in item 408 in FIG. 15, such methods epitaxially grow raised base structures on the base region and the extrinsic base regions. More specifically, as shown in FIG. 7, such methods epitaxially grow raised base structures 340/342 on the base region 310 and the extrinsic base regions 312. When growing the raised base structures 340/342, such methods first grow a first layer 340 of the raised base structures 340/342 to have a first concentration of doping material on the base region 310 and the extrinsic base regions 312. Then (potentially in a continuous process) the methods grow the upper layer 342 of the raised base structures 340/342 to have a second concentration of the doping material on the first layer 340 of the raised base structures 340/342. The second concentration of doping material is higher than the first concentration of the doping material.

As noted above, when forming the sidewall spacers 326, such methods simultaneously form raised base limiting structures 320/326 over portions of the extrinsic base regions 312 that are distal to the base region 310. The raised base structures 340/342 extend on the extrinsic base regions 312 in a direction from the base region 310 only to where the raised base limiting structures 320/326 are positioned (on the distal portions of the extrinsic base regions 312). Thus, the "raised base limiting structures" 320/326 limit the size of the raised base structures 340/342 (limit how far from the base region 310 the raised base structures 340/342 extend from the center of the base region 310).

The base region 310 has an upper surface connected to the sidewall spacers 326 by an oxide. The upper layer 342 of the raised base structures 340/342 is the surface opposite the location where the raised base structures 340/342 contact the base region 310 (the upper surface of the base region 310) and opposite the location where the raised base structures 340/342 contact the extrinsic base regions 312. The sidewall spacers 326 extend a first distance from the upper surface of the base region 310 and the raised base structures 340/342 extend a second (lesser) distance from the upper surface of the base region 310, such that the sidewall spacers 326 are taller than the raised base structures 340/342 (when measured from the upper surface of the base region 310).

Figure 8:
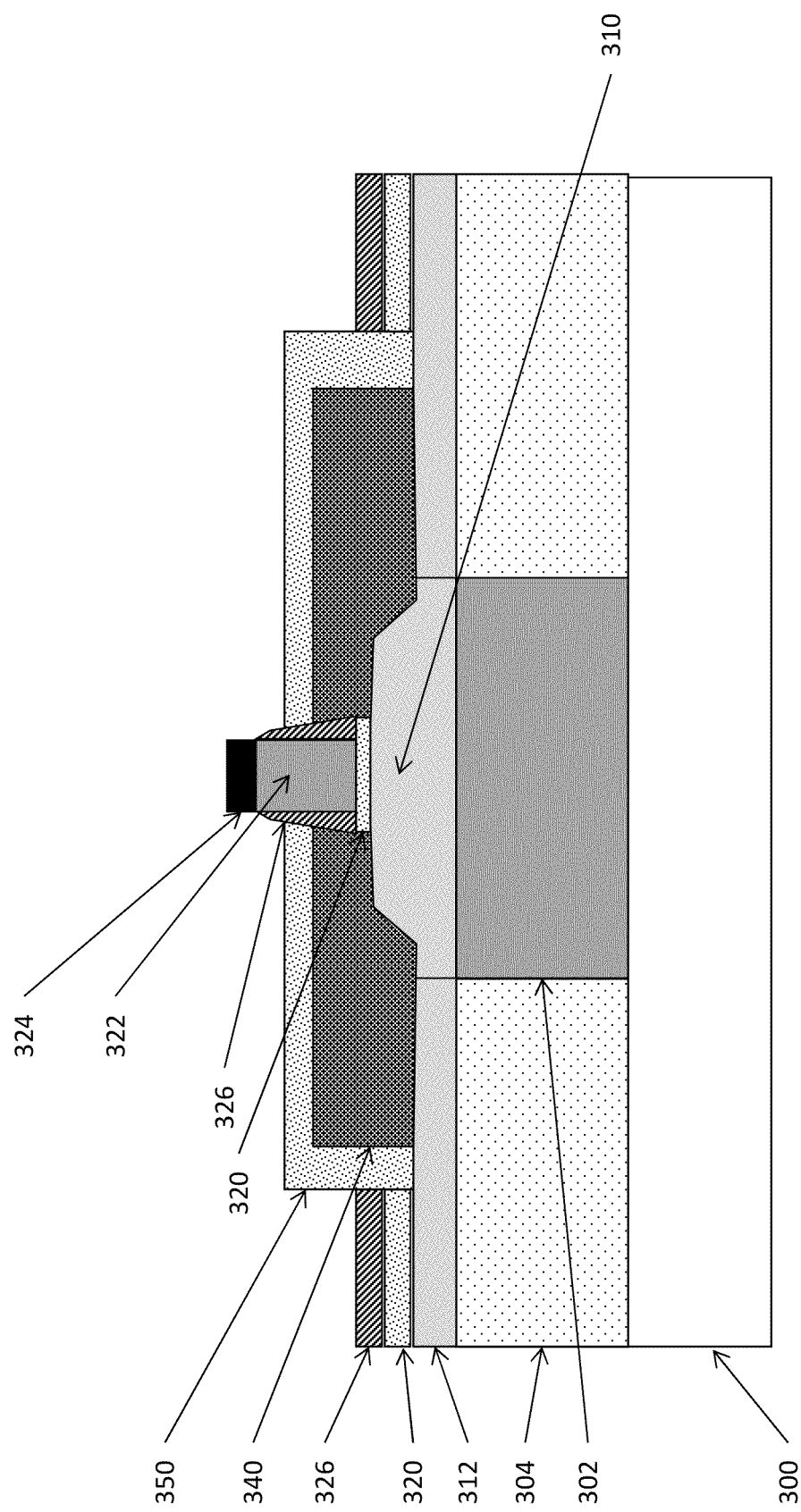
FIG. 8 is a schematic diagram of a partially completed integrated circuit structure according to methods and devices herein.

As shown in item 410 in FIG. 15, such methods then oxidized the upper layer of the raised base structures. More specifically, as shown in FIG. 8, these methods oxidize the upper layer 342 of the raised base structures 340/342. In one example, the oxidation process can be a high-pressure oxidization (HiPOX) process, or other similar process. The high-pressure oxidation process can be generally performed at lower temperatures than normal oxidation processes (because of the additional pressure utilized) and can use steam in the oxidation process. The higher doping in the upper layer 342 of the raised base structures helps increase oxidation during this oxidation processing. The oxidizing of the upper layer 342 of the raised base structures 340/342 forms an isolation layer 350. The upper surface of the isolation layer 350 is flat (planar) and generally (within 5-20 degrees) parallel to the upper surface of the base region 310.

The epitaxial growth process of the raised base structures 340/342 naturally forms a planar surface without additional processing steps, and the subsequent oxidation process maintains this planar surface shape, thereby forming a planar isolation layer 350 that does not need to be polished or planarized. Therefore, these structures are sometimes referred to herein as "self-planarizing isolation raised base structures." These self-planarizing isolation raised base structures 320/326 do not require any additional processing (such as chemical mechanical planarization (CMP)) to become planar; instead, the epitaxial process and the oxidation process themselves create a planar surface without any additional processing steps.

Figure 9:
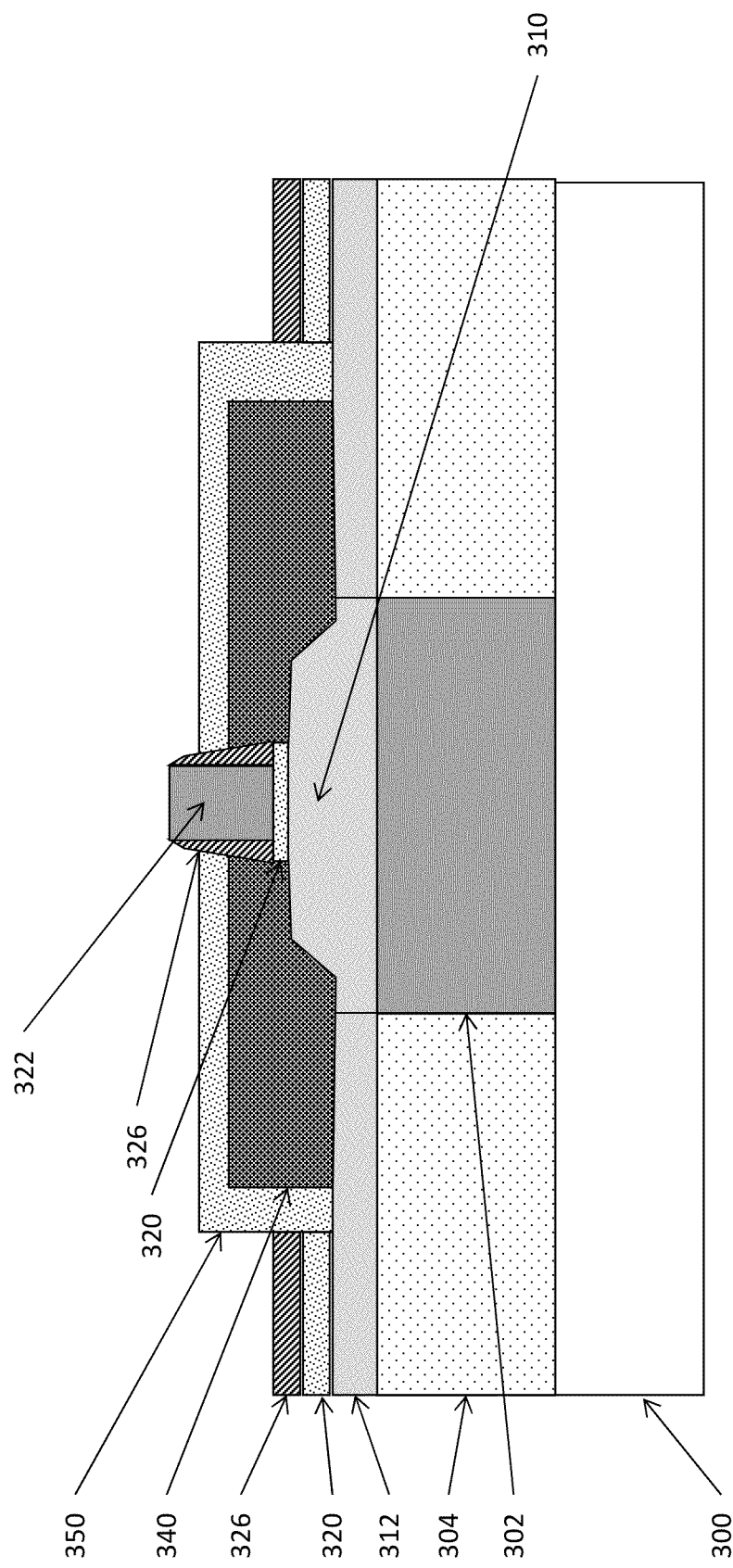
FIG. 9 is a schematic diagram of a partially completed integrated circuit structure according to methods and devices herein.
Figure 10:
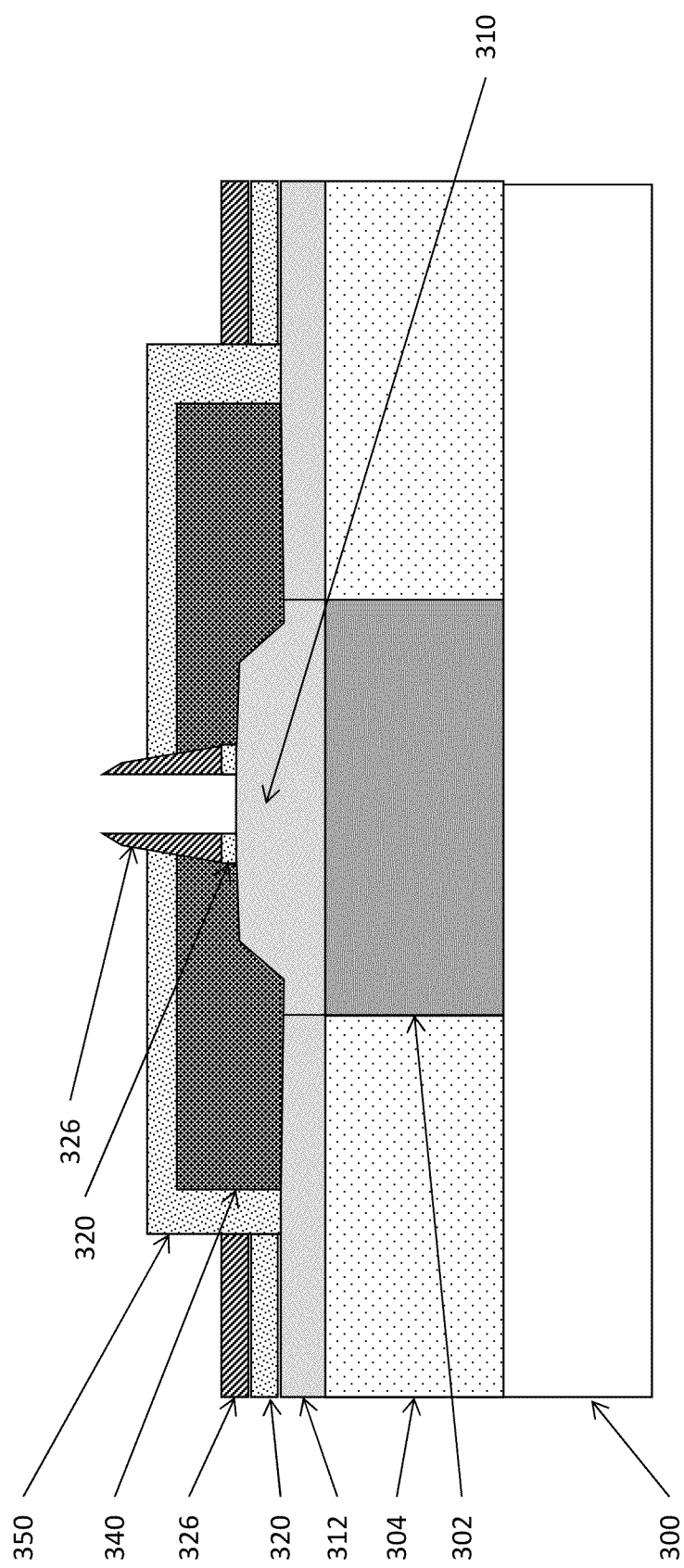
FIG. 10 is a schematic diagram of a partially completed integrated circuit structure according to methods and devices herein.

As shown in item 412 and FIG. 15, the methods then remove the sacrificial emitter and cap. More specifically, as shown in FIGS. 9 and 10, such methods remove the cap and sacrificial emitter structure 322 (including the underlying oxide) to leave an open space between the sidewall spacers 326 and to expose the base region 310 through the open space between the sidewall spacers 326. The material removal processes used in FIGS. 9-10 can be continuous or separate processes and are selective to the materials used for the cap 324, sacrificial emitter 322 and oxide 320; however, such material removal processes are controlled so that they do not substantially affect the conformal layer 326, the isolation layer 350, or the material of the collector 302.

Figure 11:
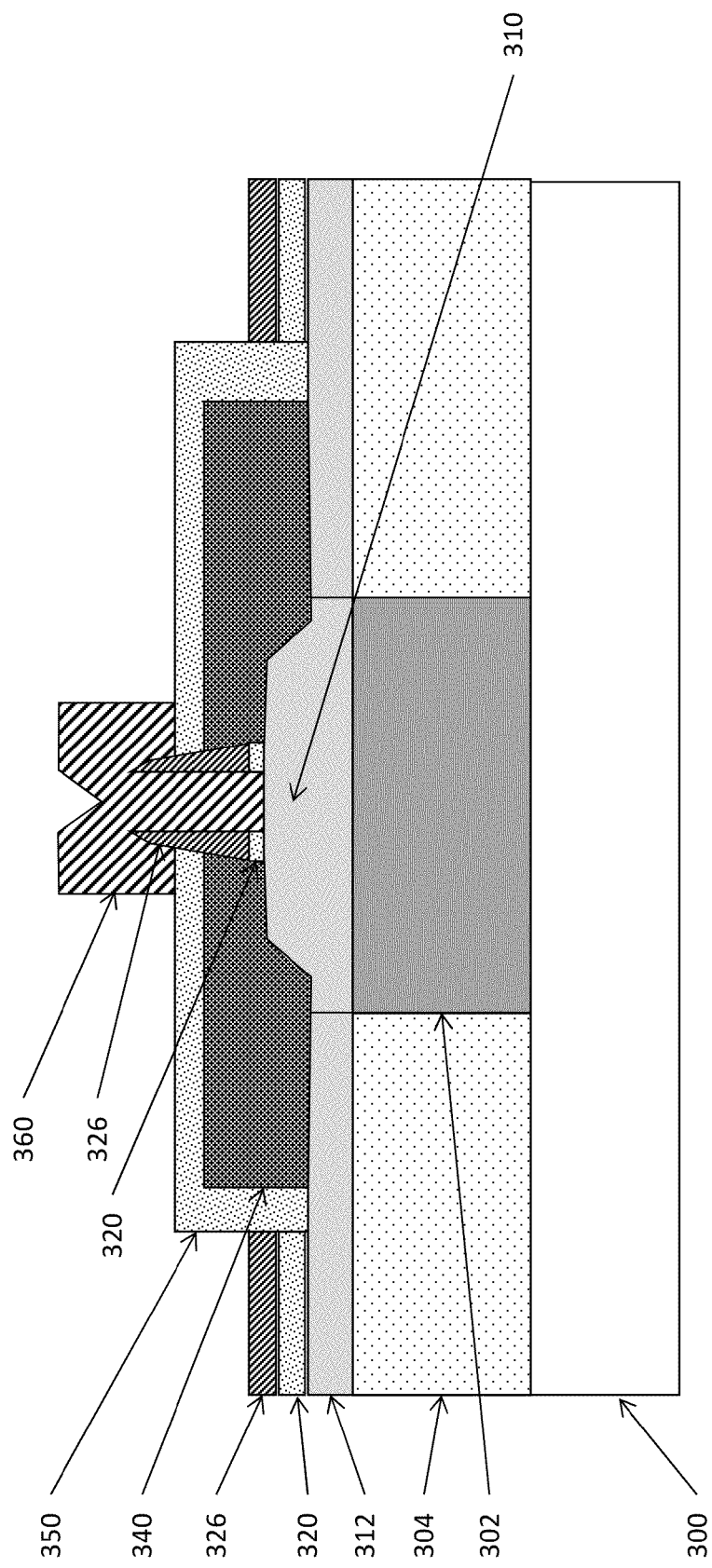
FIG. 11 is a schematic diagram of a partially completed integrated circuit structure according to methods and devices herein.

In item 414 in FIG. 15, the methods form the final emitter structure. More specifically, as shown in FIG. 11, these methods form an emitter 360 within the open space between the sidewall spacers 326 that directly contacts the upper surface of the base region 310. This processing can deposit a pre-doped material (in-situ doped material) or a material that is first deposited or grown, and subsequently doped. Again, as is understood by those ordinarily skilled in the art, the emitter will have the same doping polarity as the collector (but will be more heavily doped) and will have a polarity opposite that of the base.

The various patterning processes discussed above are also used here to limit the shape and size of the emitter 360. These processes form the emitter 360, as shown in the drawings, such that the emitter 360 extends over the sidewall spacers 326 on to the raised base structures 340/342. However, this does not affect the performance of the device because the isolation layer 350 electrically insulates the emitter 360 from the raised base structures 340/342.

Figure 12:
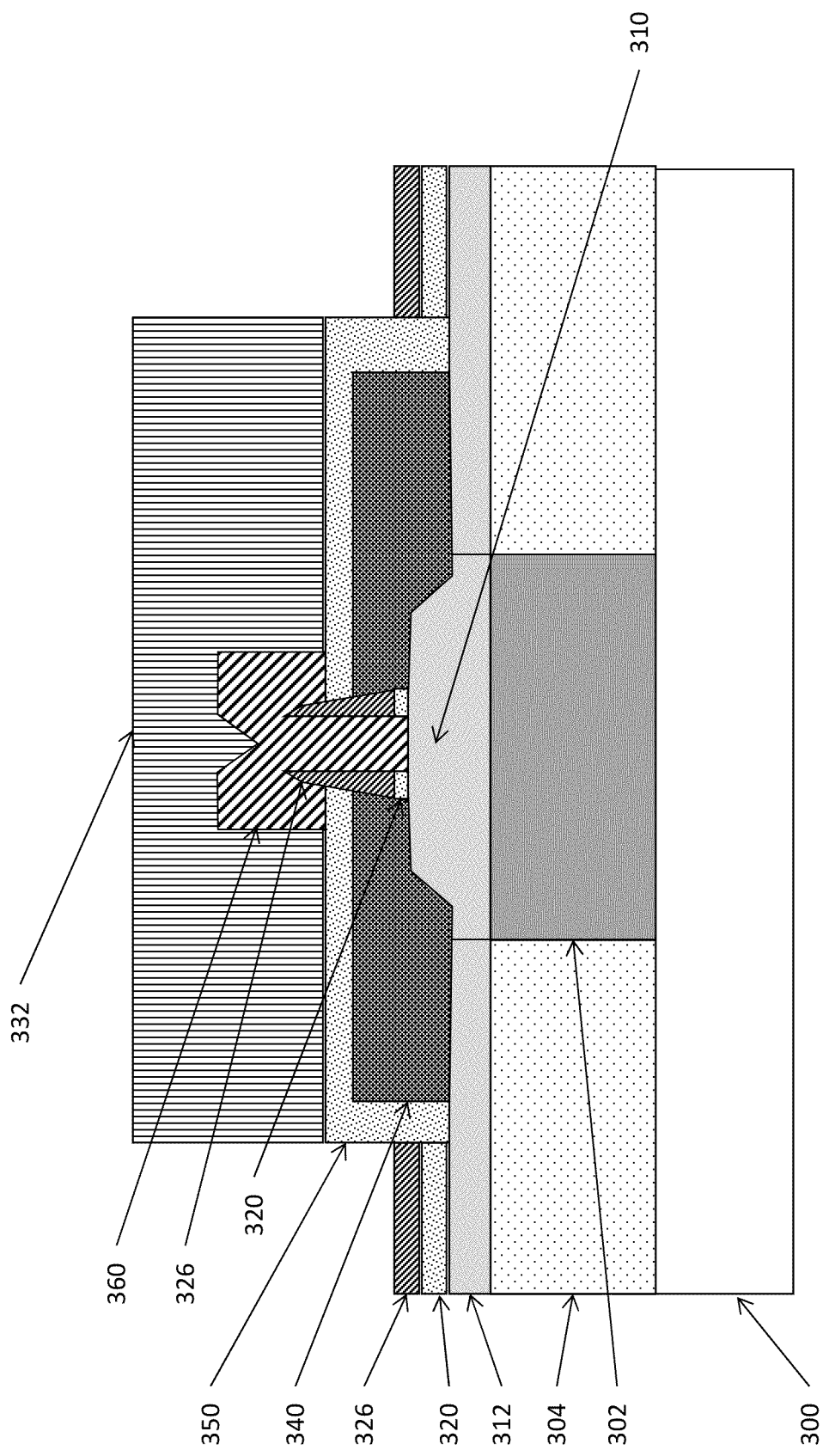
FIG. 12 is a schematic diagram of a partially completed integrated circuit structure according to methods and devices herein.
Figure 13:
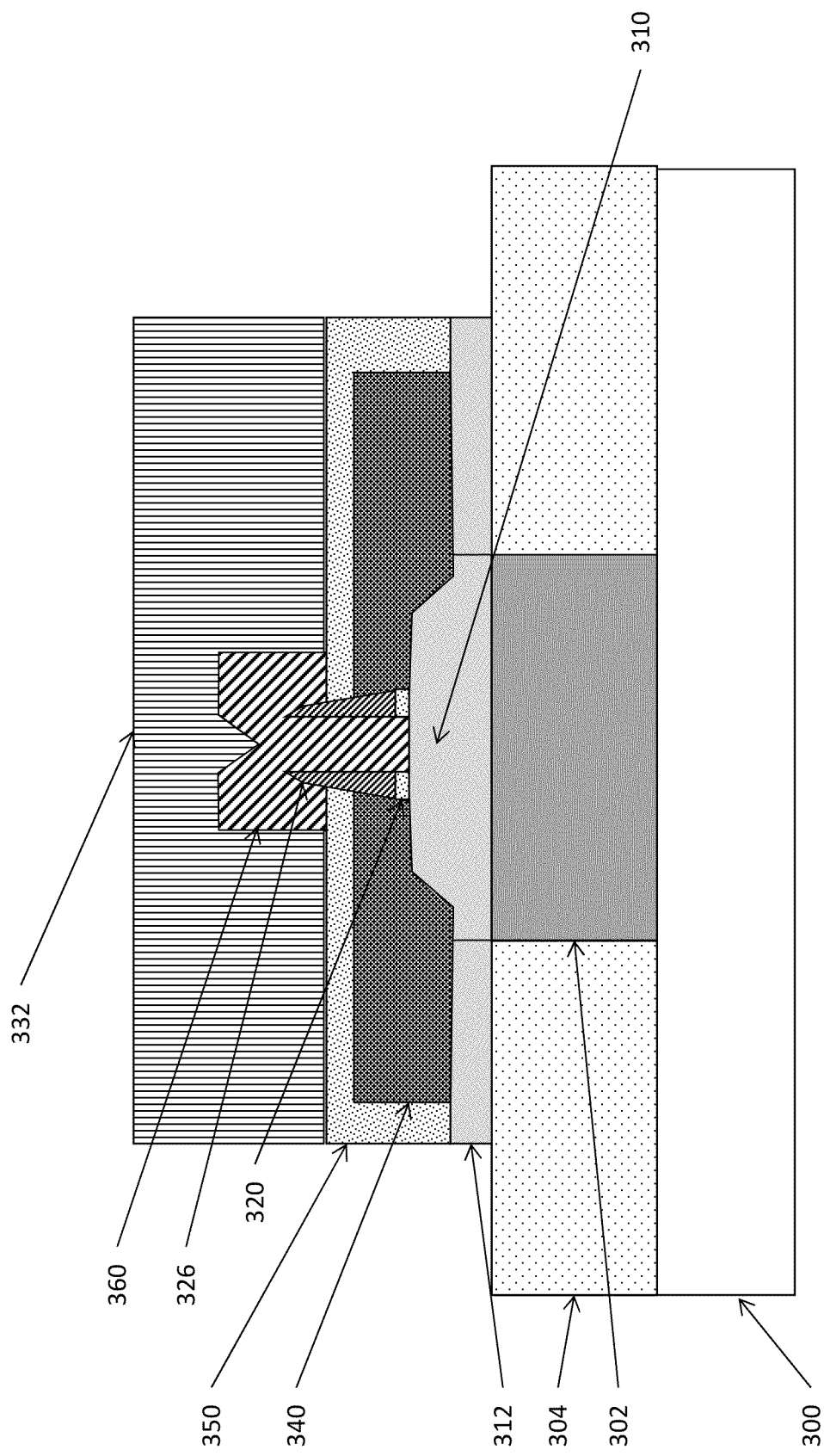
FIG. 13 is a schematic diagram of a partially completed integrated circuit structure according to methods and devices herein.
Figure 14:
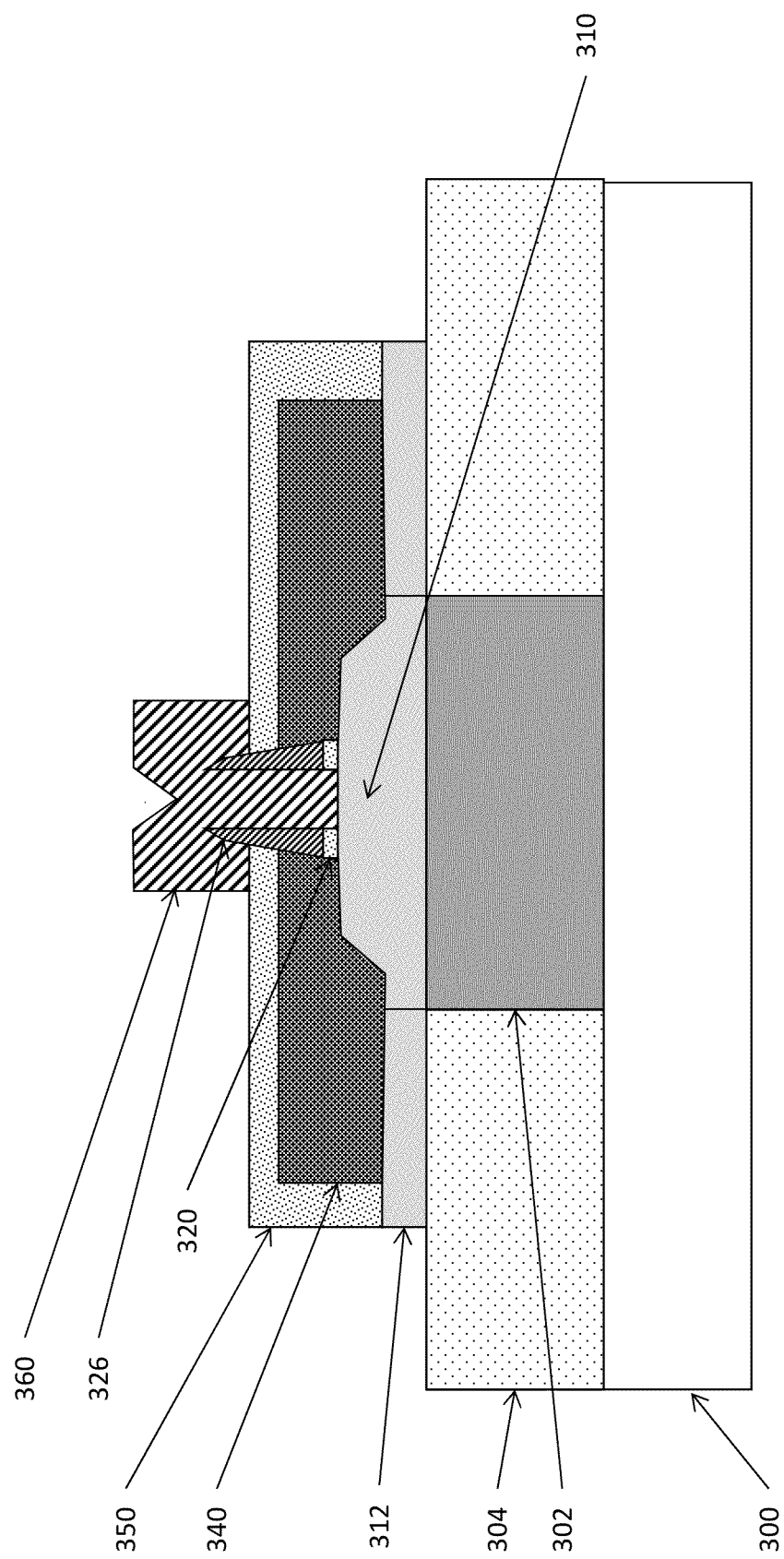
FIG. 14 is a schematic diagram of a completed integrated circuit structure according to methods and devices herein.

In FIG. 12 the same pattern used to form the photoresist structures 330 can be used with an opposite type of photoresist to form photoresist 332. Then, selective material removal processing is again used to remove the raised base limiting structures 320/326, as shown in FIG. 13. In FIG. 14, the photoresist 332 is removed revealing the final structure, that is ready for overlying isolation layers and contact formation processing well-known to those ordinarily skilled in the art.

Thus, as shown, such methods produce various integrated circuit structures (such as PNP or NPN bipolar junction transistors). Such integrated circuit structures include a collector region 302 within a substrate 300 between insulator regions (shallow trench isolation (STI) regions). An epitaxial base material is positioned on the collector region 302 and the insulator regions. This epitaxial base material comprises a base region 310 on the collector region 302 and comprises extrinsic base regions 312 on the insulator regions. Further, an emitter 360 is positioned on the base region 310. The emitter 360 has sidewalls perpendicular to the bottom surface of the emitter 360 that contacts the base region 310. The integrated circuit structure includes sidewall spacers 326 on the sidewalls of the emitter 360.

In such structures, epitaxial raised base structures 340/342 are positioned on the base region 310 and the extrinsic base regions 312. The raised base structures 340/342 comprise a lower first layer 340 on the base region 310 and the extrinsic base regions 312, and an upper layer 342 on the first layer 340 of the raised base structures 340/342. Thus, the upper layer 342 of the raised base structures 340/342 is opposite the location where the raised base structures 340/342 contact the base region 310 and the extrinsic base regions 312. The lower first layer 340 of the raised base structures 340/342 has a first concentration of doping material, and the upper layer 342 of the raised base structures 340/342 has a second concentration of the doping material that is higher than the first concentration of the doping material.

The integrated circuit structure further includes raised base limiting structures 320/326 on distal portions of the extrinsic base regions 312 that are distal to the base region 310. In some designs, the raised base limiting structures 320/326 can be retained in the final structure. The raised base structures 340/342 extend on the extrinsic base regions 312 in a direction from the base region 310 only to where the raised base limiting structures 320/326 are positioned on the distal portions of the extrinsic base regions 312. Therefore, the raised base limiting structures 320/326 are positioned on distal portions of the extrinsic base regions 312 to limit the size of the raised base structures 340/342.

The base region 310 has an upper surface connected to the sidewall spacers 326 by an oxide. The sidewall spacers 326 extend a first distance from the upper surface of the base region 310. The upper layer 342 of the raised base structures 340/342 is parallel to the upper surface of the base region 310. The upper layer 342 of the raised base structures 340/342 extends a second distance from the upper surface of the base region 310 that is less than the first distance, such that the sidewall spacers 326 are taller than the raised base structures 340/342 (when measured from the upper surface of the base region 310). Further, the sidewall spacers 326 have distal ends extending a first distance from the upper surface of the base region 310 and the emitter 360 extends a second (greater) distance from the upper surface of the base region 310. The emitter 360 extends over the sidewall spacers 326 on to the raised base structures 340/342; however, the isolation layer 350 electrically insulates the emitter 360 from the raised base structures 340/342.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a collector region between insulating shallow trench isolation regions within a substrate;
    epitaxially growing a base material on said collector region and said shallow trench isolation regions to form a base region on said collector region and to form extrinsic base regions on said shallow trench isolation regions;
    patterning a sacrificial emitter structure on said base region;
    forming sidewall spacers on said sacrificial emitter structure;
    epitaxially growing raised base structures on said base region and said extrinsic base regions in a process comprising:
        growing a first layer of said raised base structures with a first concentration of doping material on said base region and said extrinsic base regions; and
        growing an upper layer of said raised base structures with a second concentration of said doping material on said first layer of said raised base structures,
        said second concentration of said doping material being higher than said first concentration of said doping material;
    oxidizing said upper layer of said raised base structures without performing any planarization processing, said upper layer of said raised base structures being opposite a location where said raised base structures contact said base region and said extrinsic base regions, said second concentration of said doping material in said upper layer of said raised base structures increasing said oxidizing;
    removing said sacrificial emitter structure to leave an open space between said sidewall spacers; and
    forming an emitter within said open space between said sidewall spacers.

2. The method according to claim 1, said base region having an upper surface connected to said sidewall spacers by an oxide,
    said sidewall spacers extending a first distance from said upper surface of said base region,
    said oxidizing said upper layer of said raised base structures forming an isolation layer,
    said isolation layer extending a second distance from said upper surface of said base region,
    said second distance being less than said first distance, and
    said isolation layer electrically insulating said emitter from said raised base structures.

3. The method according to claim 1, said removing said sacrificial emitter structure exposing said base region through said open space between said sidewall spacers.

4. The method according to claim 1, said forming said sidewall spacers simultaneously forming raised base limiting structures over distal portions of said extrinsic base regions that are distal to said base region.

5. The method according to claim 4, said raised base structures extending on said extrinsic base regions in a direction from said base region only to where said raised base limiting structures are positioned on said distal portions of said extrinsic base regions.

6. The method according to claim 4, said raised base limiting structures limiting a size of said raised base structures.

7. A method comprising:
    forming a collector region between insulating shallow trench isolation regions within a substrate;
    epitaxially growing a base material on said collector region and said shallow trench isolation regions to form a base region on said collector region and to form extrinsic base regions on said shallow trench isolation regions;
    patterning a sacrificial emitter structure on said base region;
    forming sidewall spacers on said sacrificial emitter structure;
    epitaxially growing planar raised base structures on said base region and said extrinsic base regions in a process comprising:
        growing a first layer of said planar raised base structure with a first concentration of doping material on said base region and said extrinsic base regions; and
        growing an upper layer of said planar raised base structure with a second concentration of said doping material on said first layer of said planar raised base structure, said second concentration of said doping material being higher than said first concentration of said doping material;

oxidizing said upper layer of said planar raised base structures without performing any planarization processing, said upper layer of said planar raised base structure being planar at an end of said oxidizing, and said upper layer of said planar raised base structures being opposite a location where said planar raised base structures contact said base region and said extrinsic base regions, said second concentration of said doping material in said upper layer of said planar raised base structure increasing said oxidizing;

removing said sacrificial emitter structure to leave an open space between said sidewall spacers; and forming an emitter within said open space between said sidewall spacers.

8. The method according to claim 7, said base region having an upper surface connected to said sidewall spacers by an oxide, said sidewall spacers extending a first distance from said upper surface of said base region, said oxidizing said upper layer of said planar raised base structures forming an isolation layer, said isolation layer extending a second distance from said upper surface of said base region, said second distance being less than said first distance, and said isolation layer electrically insulating said emitter from said planar raised base structures.

9. The method according to claim 7, said removing said sacrificial emitter structure exposing said base region through said open space between said sidewall spacers.

10. The method according to claim 7, said forming said sidewall spacers simultaneously forming raised base limiting structures over distal portions of said extrinsic base regions that are distal to said base region.

11. The method according to claim 10, said planar raised base structures extending on said extrinsic base regions in a direction from said base region only to where said raised base limiting structures are positioned on said distal portions of said extrinsic base regions.

12. The method according to claim 10, said raised base limiting structures limiting a size of said planar raised base structures.

13. A method comprising:

forming a collector region between insulating shallow trench isolation regions within a substrate;

epitaxially growing a base material on said collector region and said shallow trench isolation regions to form a base region on said collector region and to form extrinsic base regions on said shallow trench isolation regions;

patterning a sacrificial emitter structure on said base region;

forming sidewall spacers on said sacrificial emitter structure;

epitaxially growing planar raised base structures on said base region and said extrinsic base regions in a process comprising:

growing a first layer of said planar raised base structures with a first concentration of doping material on said base region and said extrinsic base regions; and growing an upper layer of said planar raised base structures with a second concentration of said doping material on said first layer of said planar raised base structures, said second concentration of said doping material being higher than said first concentration of said doping material and increasing oxidation during oxidizing of said upper layer of said planar raised base structures;

said oxidizing of said upper layer of said planar raised base structures in a high-pressure oxidization (HiPOX) process, said upper layer of said raised base structures being planar at an end of said oxidizing without performing any planarization processing, and said upper layer of said planar raised base structures being opposite a location where said planar raised base structures contact said base region and said extrinsic base regions;

removing said sacrificial emitter structure to leave an open space between said sidewall spacers; and forming an emitter within said open space between said sidewall spacers.

14. The method according to claim 13, said base region having an upper surface connected to said sidewall spacers by an oxide, said sidewall spacers extending a first distance from said upper surface of said base region, said oxidizing said upper layer of said planar raised base structures forming an isolation layer, said isolation layer extending a second distance from said upper surface of said base region, said second distance being less than said first distance, and said isolation layer electrically insulating said emitter from said planar raised base structures.

15. The method according to claim 13, said removing said sacrificial emitter structure exposing said base region through said open space between said sidewall spacers.

16. The method according to claim 13, said forming said sidewall spacers simultaneously forming raised base limiting structures over distal portions of said extrinsic base regions that are distal to said base region.

17. The method according to claim 13, said planar raised base structures extending on said extrinsic base regions in a direction from said base region only to where said raised base limiting structures are positioned on said distal portions of said extrinsic base regions.

* * * * *